United States Patent [19]

Glaser et al.

[11] Patent Number: 5,237,466
[45] Date of Patent: Aug. 17, 1993

[54] METHOD AND APPARATUS FOR PROGRAMMABLY CONTROLLING SPINDLE SYNCHRONIZATION AND PHASE AMONG DISK DRIVES IN A STORAGE SUBSYSTEM

[75] Inventors: Thomas W. Glaser; Richard Greenberg; Hjalmar H. Ottesen, all of Rochester, Minn.

[73] Assignee: International Business Machines Corporation, Armonk, N.Y.

[21] Appl. No.: 430,992

[22] Filed: Nov. 2, 1989

[51] Int. Cl.$^5$ .............................................. G11B 15/46
[52] U.S. Cl. ................................ 300/73.03; 360/73.02; 360/47
[58] Field of Search ....................... 360/15, 47, 61, 63, 360/72.1, 72.2, 73.02, 73.03, 86, 98.01, 78.04; 369/14, 15, 84

[56] References Cited

U.S. PATENT DOCUMENTS

| | | |
|---|---|---|
| 2,794,066 | 5/1957 | Mullin . |
| 3,729,725 | 4/1973 | Denney et al. .................. 360/47 |
| 3,864,750 | 2/1975 | Applequist . |
| 3,983,178 | 7/1975 | Sordello ......................... 360/73.02 |
| 4,222,078 | 9/1980 | Bock . |
| 4,400,793 | 8/1983 | Schuenemann . |
| 4,722,085 | 1/1988 | Flora et al. . |
| 4,862,411 | 8/1989 | Dishon et al. ................... 360/15 |
| 4,907,105 | 3/1990 | Kurzweil, Jr. ................... 360/73.02 |

OTHER PUBLICATIONS

Electronic Design, "Parallel disk assembly packs 1.5 Gbytes, runs at 4 Mbytes/s" by Nicholas Mokhoff, Nov. 12, 1987, pp. 45–46.

Electronic Engineering Times, "CDC Tops 3½-Inch Pack with 172-Mbyte Drive" by Terry Costlow, Oct. 5, 1987, p. 10.

"Synchronized Dual Copy For Latency and RPS Miss Penalty Reduction", Disclosed Anonymously, Research Disclsoure, Jul. 1988, No. 291, Kenneth Mason Publications Ltd. England.

Primary Examiner—Jerry Smith
Assistant Examiner—Steven R. Garland
Attorney, Agent, or Firm—Richard E. Billion; Steven W. Roth

[57] ABSTRACT

A data processing system is disclosed having a direct access storage device (DASD) subsystem comprising a number of separate physical housings, each housing having a number of disk supporting spindles mounted therein. The velocity of rotation of the spindles within a housing is synchronized, and the rotational position of the spindles may be locked into a fixed relationship. When number N of disk supporting spindles are provided, spindle rotation is synchronized, and mirrored data files are written out of phase by 360/N degrees, thereby providing reduced latency time during a subsequent read operation, while at the same time providing data integrity through the use of redundant data files.

24 Claims, 5 Drawing Sheets

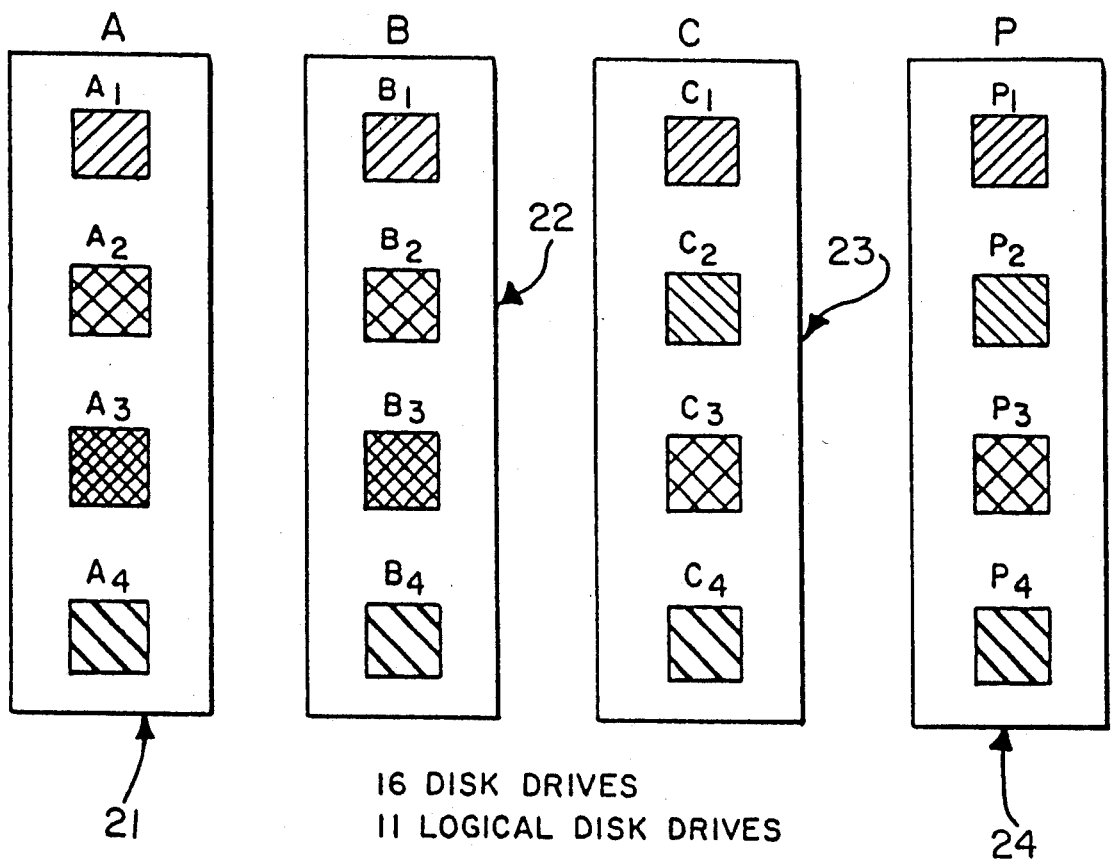

16 DISK DRIVES
11 LOGICAL DISK DRIVES

 = MIRRORED DATA DISK DRIVES $A_3$, $B_3$
(TWO LOGICAL DISK DRIVES)

 = INTERLEAVED DATA DISK DRIVES $C_2$, $P_2$
(ONE LOGICAL DISK DRIVE)

 = INTERLEAVED DATA WITH PARITY $A_4$, $B_4$, $C_4$, $P_4$
DISK DRIVES (ONE LOGICAL DISK DRIVE)

 = CHECK SUMMED DATA DISK DRIVES $A_1$, $B_1$, $C_1$, $P_1$
(THREE LOGICAL DISK DRIVES)

 = NORMAL DATA DISK DRIVES $A_2$, $B_2$, $C_3$, $P_3$
(FOUR LOGICAL DISK DRIVES)

FIG. 6

METHOD AND APPARATUS FOR PROGRAMMABLY CONTROLLING SPINDLE SYNCHRONIZATION AND PHASE AMONG DISK DRIVES IN A STORAGE SUBSYSTEM

FIELD OF THE INVENTION

The invention pertains to the field of data processing systems having direct access storage device (DASD) data memory or data storage subsystems, and more particularly to DASD subsystems comprising a number of separate and individual physical housing, each housing having a number of disk supporting spindles mounted therein, the velocity of rotation of the spindles within a housing being synchronized, and the rotational position of the spindles within a housing being locked into a fixed relationship.

BACKGROUND OF THE INVENTION

Data processing installations that use direct access storage devices (DASD), such as disk file storage subsystems that store binary data on floppy or rigid magnetic or optical recording disks, many times experience data processing problems such as slow response time and/or poor data availability. Slow response time may be caused by one disk file being accessed most of the time, while the other disk files are used only infrequently. Poor availability of data may be caused by one disk file having recurring errors, or by a disk file being out of commission due to a malfunction. As a result, the data processing industry often resorts to backing up frequently used data on-line, or the data may be redistributed to other disk files.

As the price of DASD files has dropped over the years, the concept of packaging more than one disk spindle in a common housing or box has been developed. With such a storage subsystem packaging scheme, more efficient data processing operation is possible. For example, it is usually desirable to limit the data storage capacity that is contained under any one disk access arm. Since the density of disk data storage has increased markedly, and is continuing to increase, each spindle of a multiple spindle device can be made of a small physical size, thus facilitating the packaging of a number of these small spindles in one physical housing.

The present invention makes use of a number of such a multiple spindle, unitary, DASD devices to form optimized forms of data storage, including the mirroring of data files and the interleaving of data files.

As a feature of the invention, a direct access storage device subsystems may comprise a number of separate physical housings, each housing having a number of disk supporting spindles mounted therein.

U.S. Pat. No. 3,864,750 is of interest relative thereto in that this patent describes a magnetic disk system that includes four packs of magnetic disks having a single rotary head access mechanism positioned in the middle of the disk packs. However, in this device all four disk packs are driven by a single motor and a single timing belt, and thus the variable rotational spindle position of the present invention cannot be achieved.

As a feature of the invention, a direct access storage device subsystem may comprise a number of separate and individual disk drives or files, wherein for purposes of data integrity the data is mirrored by writing the same data to common addresses of each disk drive.

U.S. Pat. No. 4,722,085 is of interest relative thereto in that this patent describes a magnetic disk storage system having a number of disk files wherein data is written in parallel to a common addressed sector location on each of the disk files. However, in this device each disk file operates independent of all other disk files within the system, and no provision is made to provide an optimum positional relationship between the location of the addressed disk sector and the accessing heads of the various disk files.

The publication *Electronic Design*, Nov. 12, 1987, at pages 45–46, is also of interest in that it describes a disk drive system in which five spindle-synchronized disk drives are used to store data. Data is stored on four of the disk drives by way of simultaneous parallel data transfer. The fifth disk drive is used as a parity drive. The fifth drive may also be used to replace failed data drive, if such a failure should occur.

A feature of the invention provides for servo control among the spindles of a multiple spindle DASD unit. In this connection, it is known that others have linked a number of disk drives using a phase locked loop feedback mechanism. In this way, the rotation of two or more disk drives was synchronized so that data could be written to or read from multiple drives quickly. Deskewing logic was required in the disk drive controller in order to implement this feature. (*Electronic Engineering Times*, page 10, Oct. 5, 1987)

As a feature of the invention, mirrored data files are stored on the disks of a multiple spindle DASD device in a positionally staggered relationship, such that response time and/or data availability is improved.

In the unrelated art of change coupled device (CCD) data storage devices, means have been provided to reduce the mean access time to data storage blocks by moving the most likely next block of data to be accessed to an optimum position for accessing. U.S. Pat. No. 4,400,793 is an example.

Use of the present invention also enables the interleaving of data among the disks of a multiple spindle DASD unit. Data interleaving is old per se, as is exemplified by the magnetic tape storage means describes in U.S. Pat. Nos. 2,794,006 and 4,222,078 for example.

While others have attempted to provide more efficient use of DASD subsystems by a data processing system, there remains a need to provide yet greater improvement in DASD response time and/or DASD data availability.

SUMMARY OF THE INVENTION

The spirit and scope of the present invention involves the provision of a direct access storage device (DASD) data processing subsystem comprised of a number of disk supporting spindles that can be variably synchronized in both rotational velocity and rotational position.

While the invention is not to be limited thereto, the invention has particular utility where the subsystem is comprised of a number of physically separate DASD units, each physically separate unit of which includes within its single housing a number of disk supporting spindles. Preferably, each spindle supports a number of rigid disks, for example eight magnetic recording disks. Within the spirit and scope of the invention, each of these spindles may have a separate read/write transducer or head access arm, or a single arm may be provided for all spindles within each physically separate unit.

For example, if there are two spindles in one packaged DASD unit, each spindle assembly generates a position-determined index signal, which signal occurs once during each spindle revolution. A controllable means is provided to enable the user, i.e. the installing engineer or the data processing operating system, to provide a fixed, or locked, relationship between the time of occurrence of these index signals for the various spindles. For example, considering the time of occurrence of the index signal for one of these spindles to be a reference position identified as zero degrees, the second spindle could be synchronized to have its index signal appear 180 degrees of spindle rotation thereafter. If three spindles exist per separate DASD package, in accordance with the invention a means is provided to align the time of occurrence of the three respective index signals in a defined relative positional, i.e. rotational, alignment.

A basic feature of the invention is to provide maximum flexibility in the velocity and positional synchronization between the spindles in a DASD data processing subsystem. This requires a programmable, i.e. a controllable, interaction between the spindle motion control systems of all spindles in the subsystem.

As a result of the spindle rotation/position programmability that is provided by the invention, the various disk supporting spindles of a DASD system can be programmed, or set, to a known phase relationship. Synchronizing the disk files to a known phase relationship improves the performance of the DASD subsystem when operating to support the various combinations of data storage schemes that may be required by the data processing system. The invention provides reduced latency time during a data-read operation, while at the same time providing data integrity through the use of redundant data files. For example, when two spindles are used to provide mirrored data storage, providing a 180 degree phase relationship between the two spindles, in accordance with the invention, reduces the access time to the mirrored data.

The programmability provided by the invention facilitates the selection of a number of modes of data storage on the disks of synchronized DASD files.

As used herein, the term synchronized DASD files, disks, or spindles is intended to mean that the disks of all DASD files are rotating at the same, or at substantially the same, rotational velocity, and that the rotational positions of the disks bear a known, predetermined, phase relationship to each other. For example, if the three spindle means of three individual DASD files are synchronized, the spindles are all rotating at the same speed, the disk(s) supported by one of the spindles generates a master index pulse or signal once for each revolution of the disk, and the disks of the other spindles generates an index signal at a known phase relationship to this master index signal.

With the use of the number M of synchronized DASD files in accordance with the invention, when all spindles are in phase, an increased data rate can be realized by operating the M files in parallel as one file. The data can then be spread among the disk files in interleaved fashion, and an increased data rate equal to M times the data rate of one of the files can be realized.

This in-phase spindle relationship is also useful when data is stored as a checksum file. Here again, the M files appear to the data processing system as one file. One of the M files stores the exclusive OR of the remaining files.

In accordance with the invention, increased data integrity and data processing performance is achieved by the use of mirrored data files that are written to the number M of DASD files. More specifically, M data files are written, each files having identical data content, are written to M DASD files whose individual phase relationship is 360/M degrees. Data integrity is improved because all of the DASD files must fail before the data is lost. Data processing performance is improved because only the one DASD file that can access the data in the shortest time need be used in a read operation. In this way, the latency time of a disk file subsystem, comprising M individual disk files, is reduced by the factor 1/M. For example, if the expected latency time of each individual disk file in the subsystem is equal to X time units, then the latency time for accessing mirrored files stored within the subsystem in accordance with the invention is equal to X/M.

The present invention employs a number of disk drives of conventional construction and arrangement. As a feature of the invention, but without limitation thereto, a plurality of single disk or multiple disk spindles are located in a common housing. Each such disk spindle may be provided with its own head accessing mechanism, or, if desired, a common head accessing mechanism may be provided to service all of the disk spindles within a common housing.

Since the present novel and unobvious invention may be implemented using conventional disk drives, the following explanation will not describe the electrical and/or mechanical construction of such disk drives in detail. Those skilled in the art will find that the following description and related drawing will readily enable practice of the invention.

An object of the invention is to provide a disk file memory subsystem method and apparatus for use in a data processing system wherein a plurality M of individual disk files may be selectively synchronized in positional rotation.

As a feature of the invention, mirrored data files can be stored on the disks within each of the M disk files, the data files being postionally staggering such that mirrored data is stored on each of the M disk drives at positions that are staggered by 360/M degrees of disk rotation.

In a preferred embodiment of this arrangement of mirrored data storage in accordance with the invention, a master index signal is generated for each revolution of the disks of one of the M disk files or an electronically generated master index signal, and this master index signal is provided to all other of the M disk files as a reference position by which the positional staggering may be determined and controlled.

These and other objects and advantages of the invention will be apparent to those of skill in the art upon reference to the following detailed description of the invention wherein reference is made to the drawing.

BRIEF DESCRIPTION OF THE DRAWING

FIG. 6 is a showing of the manner in which the FIG. 1 embodiment of the invention can be used to store mirrored data files, interleaved data files, interleaved data files with parity, checksummed data files, and normal data files.

DETAILED DESCRIPTION OF THE INVENTION

The invention provides a direct access storage device (DASD) subsystem that is comprised of a number of disk supporting spindles that can be variably synchronized in both rotational velocity and rotational position.

While the invention is not to be limited thereto, the invention has particular utility where the subsystem is comprised of a number of physically separate, large data capacity, DASD units, each physically separate unit of which includes within its single housing a number of low data capacity disk supporting spindles. Preferably, each spindle supports a number of low data capacity disks. As is well known, each of these spindles is provided with its own separate read/write transducer or head access arm, or a single arm may be provided for all spindles within each physically separate unit.

A basic feature of the invention is to provide flexibility in the velocity and positional synchronization between the spindles in a DASD data processing subsystem. This requires a programmable or controllable interaction between the spindle motion control systems of all spindles in the subsystem.

As a result of this spindle rotation/position programmability, the disk files may be set to a known phase relationship, thereby improving the performance of the DASD subsystem when operating to support the various combinations of data storage schemes that may be required by the data processing system.

Figure 1:
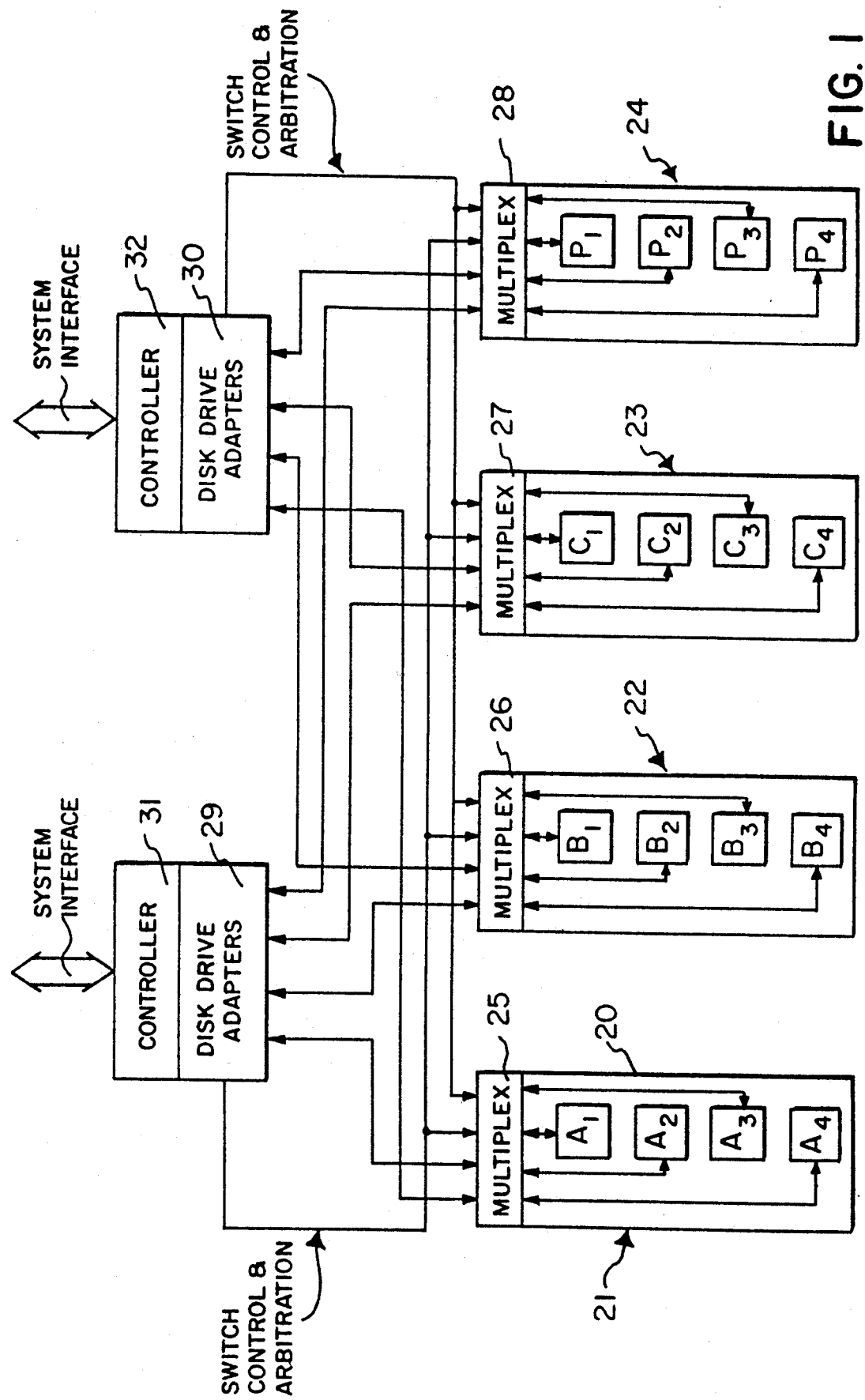
FIG. 1 shows a DASD storage subsystem in accordance with the invention wherein four small data capacity disk drives are combined or clustered in a single housing to form each of the four large data capacity disk files.

As shown in FIG. 1, a number of (i.e. four) small form factor disk drives of conventional construction and arrangement are provided to form one large form factor disk drive. As a feature of the invention, but without limitation thereto, this plurality of small disk drives or spindles are located in a common housing to form the one large disk drive. Each such disk spindle may be provided with its own head accessing mechanism, or, if desired, a common head accessing mechanism may be provided to service all of the disk spindles within a common housing.

More specifically, FIG. 1 shows a DASD subsystem in accordance with the invention wherein four small form factor (i.e. small data storage capacity) disk files are packaged to form one large form factor disk file, the four small form factor disk files being spindle synchronized in accordance with the present invention. For example, four small form factor disk drives A1, A2, A3 and A4 are packaged into a single housing 20 to form one large form factor disk drive 21. In a similar manner, three other large form factor disk drives 22, 23 and 24 are provided. By way of example, but without limitation thereto, the small form factor disk drives may be rigid or floppy disk drives of a well known construction and arrangement. Each of the large form factor disk drives 21-24 is controlled by its own multiplexer means 25-28, respectively, thus providing selective access to the four small disk drives within the large disk drive 21-24, as is well known.

Writing data to, or reading data from, the four large capacity disk drives 21-24 is controlled in a well known manner by four disk drive adapters 29-30, which adapters are in turn controlled in a well known manner by four controllers 31-32, respectively, thereby providing a system interface to a higher level data processing system (not shown). In the exemplary DASD system shown in FIG. 1, adapters 29-30 provide switch control and arbitration functions, as is well known by those of skill in the art.

The DASD industry has recognized that the formation of one large form factor disk drive by the use of a number of smaller form factor disk drives provides a number of advantages, including faster access time, higher availability of data, and better volumetric efficiency.

As will be apparent, the DASD subsystem of FIG. 1 optimizes data storage, in accordance with the invention, by providing a programmable variety of virtual data configurations within each package 21-24 of clustered, small form factor, disk drives. In its basic form, the invention provides programmable or selectable synchronization of the rotational position of the four small form factor disk drives that exist within each of the large form factor disk drives 21-24.

While the invention will be described in this above described four-to-one relationship, the spirit and scope thereof is not to be limited to this specific configuration.

The manner in which data is stored on the disk(s), i.e. the data storage format, is not critical to the invention. All that is required by the invention is that at least one index signal or mark be generated or provided for each revolution of the disk(s) that is supported by each of the grouped spindles. Thus, if there are four spindles in a group, four index signals are generated, one for each revolution of each spindle. In a preferred embodiment of the invention, the index signal is provided by reading a magnetically recorded index signal that is incorporated as part of the track format of each disk track. However, within the scope and spirit of the invention the index signal could also be provided by a position sensing transducer that is associated with the disk-supporting spindle itself, or it could be electronically generated by an oscillator providing one index pulse per revolution.

Figure 2:
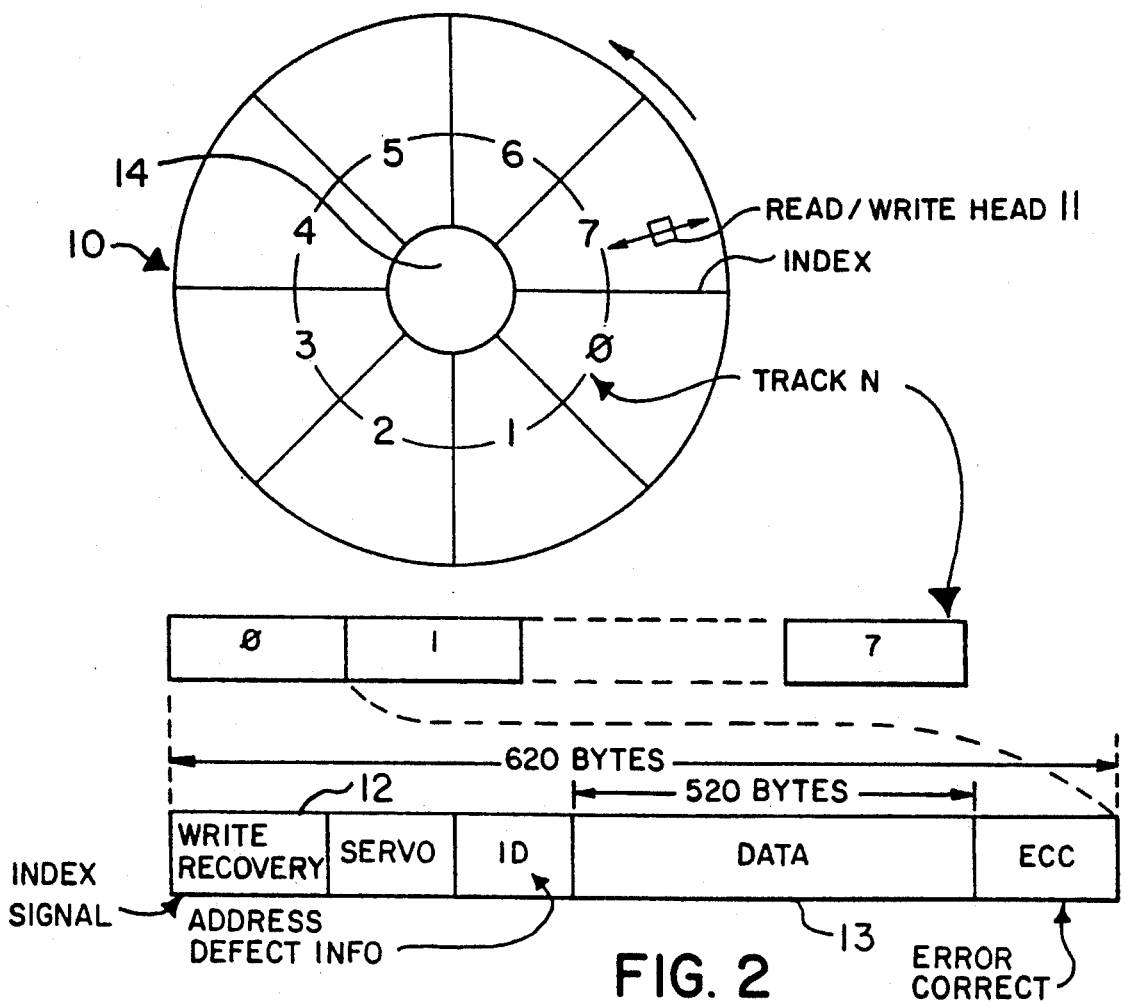
FIG. 2 shows a preferred format by which data is stored on the disk or disks of each of the small capacity disk drives of FIG. 1.

FIG. 2 shows a preferred form of disk format, without limitation thereto. In this figure a CCW rotating disk 10 is shown supported on a spindle means 14, and as having eight data sectors per recording track, one circular track of which is identified in the figure as track N. A circumferentially-stationary transducing or read/write head 11 is mounted to move generally radially of disk 10, on either an arcuate or a linear path, as is defined by the type of head actuating mechanism (not shown) used in the disk drive(s). Reading of this index mark by head 11 enables the disk drive controller (not shown) to determine the position of disk 10 during each rotation of the disk, independent of which track is currently being accessed (i.e. being read or being written) by head 11. A measure of the time that expires between consecutive occurrences of the index mark provides a measure of the speed of rotation of disk 10.

As will be apparent, the index mark or signal that is provided once during each revolution of the disk spindle is used, in accordance with the invention, to provide (1) speed synchronization between a number of disk drive spindles, and (2) positional synchronization between these disk drive spindles.

Each sector of each recording track includes other portions, portion 13 of which comprises the data processing system's variable data that is recorded at the particular spindle, disk, track and sector that is identified or addressed by the disk drive controller.

Figure 3:
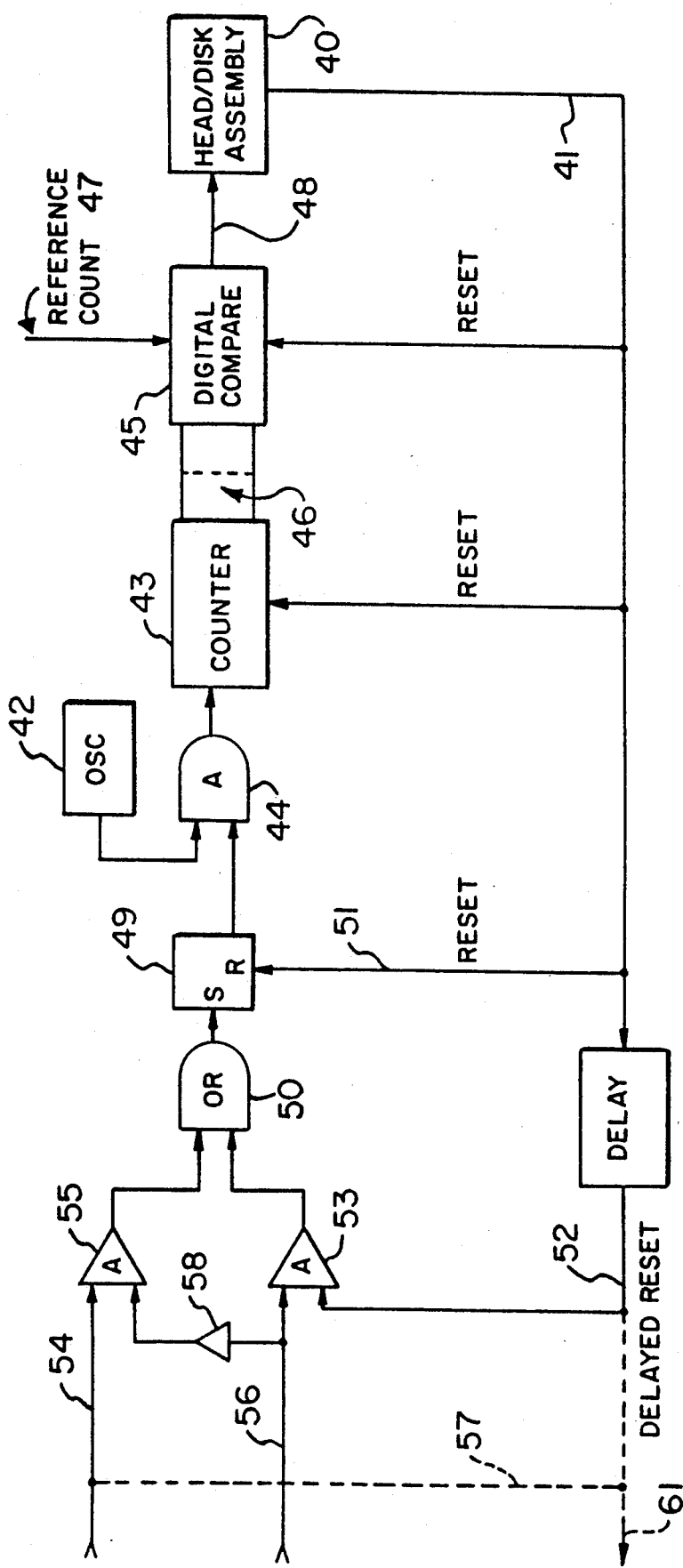
FIG. 3 shows the spindle motion control means that is provided for each of the small data capacity disk drives of FIG. 1.

The invention provides maximum flexibility in controlling the synchronization or relative spindle positions of the individual disk supporting spindles that are within a multi-spindle disk file cluster such as cluster 21, cluster 22, cluster 23 or cluster 24 of FIG. 1. This feature of the invention requires programmable interaction between the spindle motion control means that is provided for the individual spindles within each disk file cluster. FIG. 3 shows one such spindle motion control means in accordance with an embodiment of the invention, but without limitation to the details thereof. In this figure, reference numeral 40 identifies the head/disk/spindle assembly of one of the disk drives shown in FIG. 1, for example small form factor disk drive A1 within large form factor DASD unit 21. Assembly 40 provides an index signal on conductor 41. For example, one signal pulse 41 occurs for every revolution of the disk supporting spindle within disk drive A1.

The speed of rotation of this spindle is determined by the magnitude of reference count input 47. The output pulses from constant frequency oscillator or clock 42 are applied to counter 43 by way of an AND gate 44. Digital comparator 45 compares the output count 46 within counter 43 to reference count 47, as this output count 46 exists at the time of the occurrence of each of the index signals generated on conductor 41 by assembly 40. Count 47 represents the spindle drive velocity that is to be maintained by the spindle drive motor that is located within assembly 40. The spindle motor velocity is controlled by a proportional error output signal 48 that is provided by the output of digital comparator 45, so as to maintain the count that exits in counter 43 upon the occurrence of each index signal substantially equal to reference count 47, as is well known by those skilled in the art.

AND gate 44 is enabled/disabled by the state of flip-flop means 49. Functionally, AND gate 44 is enabled by OR gate 50, and by the resulting set state of flip-flop 49, shortly after each index pulse 41 is received. Counter 43 now begins to count the pulses provided by oscillator 42 during rotation of the spindle. Subsequently, upon the completion of 360 degrees of rotation of the spindle, and the resulting occurrence of the next index pulse 41, AND gate 44 is disabled, as flip-flop 49 is reset by the index signal present on conductor 51. The count now contained within counter 43 is a measure of the actual velocity of the spindle during this 360 degrees of rotation. This count is compared to reference count 47, and energization of the spindle motor is controlled accordingly.

More specifically, flip-flop 49 can be set (thus enabling oscillator 42 to drive counter 43) by the output of OR gate 50 upon (1) the occurrence of an output pulse on delayed reset line 52 (by way of AND gate 53), or upon (2) the occurrence of an external set signal on conductor 54 (by way of AND gate 55). These two setting conditions for flip-flop 49 are mutually exclusive in that the the setting signal 52,54 to be effective is controlled by the high/low state of a control signal that is present on conductor 56.

Figure 4:
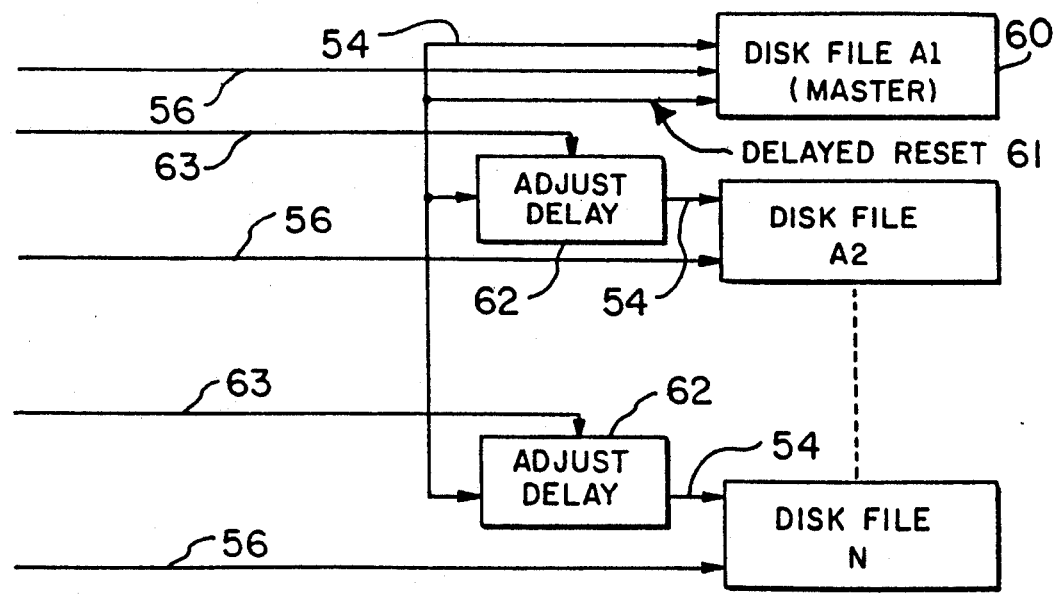
FIG. 4 shows a large data capacity cluster of disk files, comprising four of the small data capacity disk drives of FIG. 1, wherein each of the disk drives is provided with the spindle motion control means of FIG. 3.

Note that the index signal on conductor 41 operates to reset comparator 45, counter 43 and flip-flop 49. However, the output 48 of comparator 45 is held for a period of time after this reset has occurred, in order to achieve velocity control of the spindle motor, as is well known by those of skill in the art. FIG. 4 shows a cluster of disk drives, each drive having a disk supporting spindle, wherein the number of disk drives and spindles within the cluster is equal to N. For example, if FIG. 4 is compared to FIG. 1, N equals four disk drives.

The disk drive or spindle that is designated as 60 in FIG. 4 is the master disk drive of the cluster, i.e. it is the disk drive whose delayed index signal 61 (i.e. delayed reset signal 52 of FIG. 3) is the controlling parameter to which the rotational positions of the other spindles may be synchronized, depending upon the high/low state of each disk drive's control signal 56. The spindle motion control means of all of the disk drives shown in FIG. 4 are substantially identical to that shown in FIG. 3.

For master disk drive 60, the delayed reset signal 61 that is generated by the spindle position of disk drive 60 is connected directly to the external set signal conductor 54 for that disk drive (see the dotted line 57 of FIG. 3). However, for all others of the disk drives of the FIG. 4 cluster, the delayed reset signal 61 that is generated by master disk drive 60 becomes the external set signal 54 for those other disk drives only under the control of a controllable programmable means in the form of an adjustable delay network 62, and only under the control of the high/low state of that disk drive's control signal on conductor 56.

With reference to FIG. 3, and assuming that the control signal on conductor 56 is in a high state, in this case AND gate 55 of that disk drive motion control means is disabled by operation of invertor 58, and AND gate 53 is enabled. As a result, the spindles of that disk drive is individually velocity controlled, in the manner above described. No programmed spindle position is provided relative the master disk drive. Thus, the disk drive motion control means for this disk drive functions independently.

Assume now that the control signal on conductor 56 of a disk drive is in a low state. In this case the AND gate 55 of the disk drive motion control means is enabled, and AND gate 53 of the motion control means is disabled. This disk drive is now index signal synchronized to the position of the spindle of the master disk drive. That is, the flip-flop 49 of the motion control means is now set by the delayed reset signal 61, as this signal is generated by the index signal 41 of the master disk drive.

In accordance with the invention, the programmability of the respective spindle positions for the various disk drives of the FIG. 4 cluster (i.e. the respective time of occurrence of the index signal for each spindle) is achieved by the programming signal that is present on the control conductor 63 for each individual disk drive.

In an exemplary embodiment of the invention where the number of disk drives N in FIG. 4 equalled three, and where mirrored data files were written to the three disk drives, delay network 62 for disk drive A2 was set to achieved a 120 degree delay in the occurrence of the index signal for disk drive A2, and delay network 62 for disk drive A3 (i.e. disk drive N of FIG. 4) was set to achieved a 240 degree delay (i.e. and additional 120 degree delay) in the occurrence of the index signal for disk drive A3. Assuming that a data access command for this mirrored file occurs at 90 degrees of rotation of the spindle of disk drive A1, the closest position of the mirrored file data for this data access command is the file as it is stored on the disk(s) of disk file A2. Thus, in this assumed example the file will be accessed after an additional 30 degrees of spindle rotation. Should this access of disk drive A2 fail, the data would then be accessed from disk drive A3 after an additional 120 degrees of spindle rotation.

Figure 5:
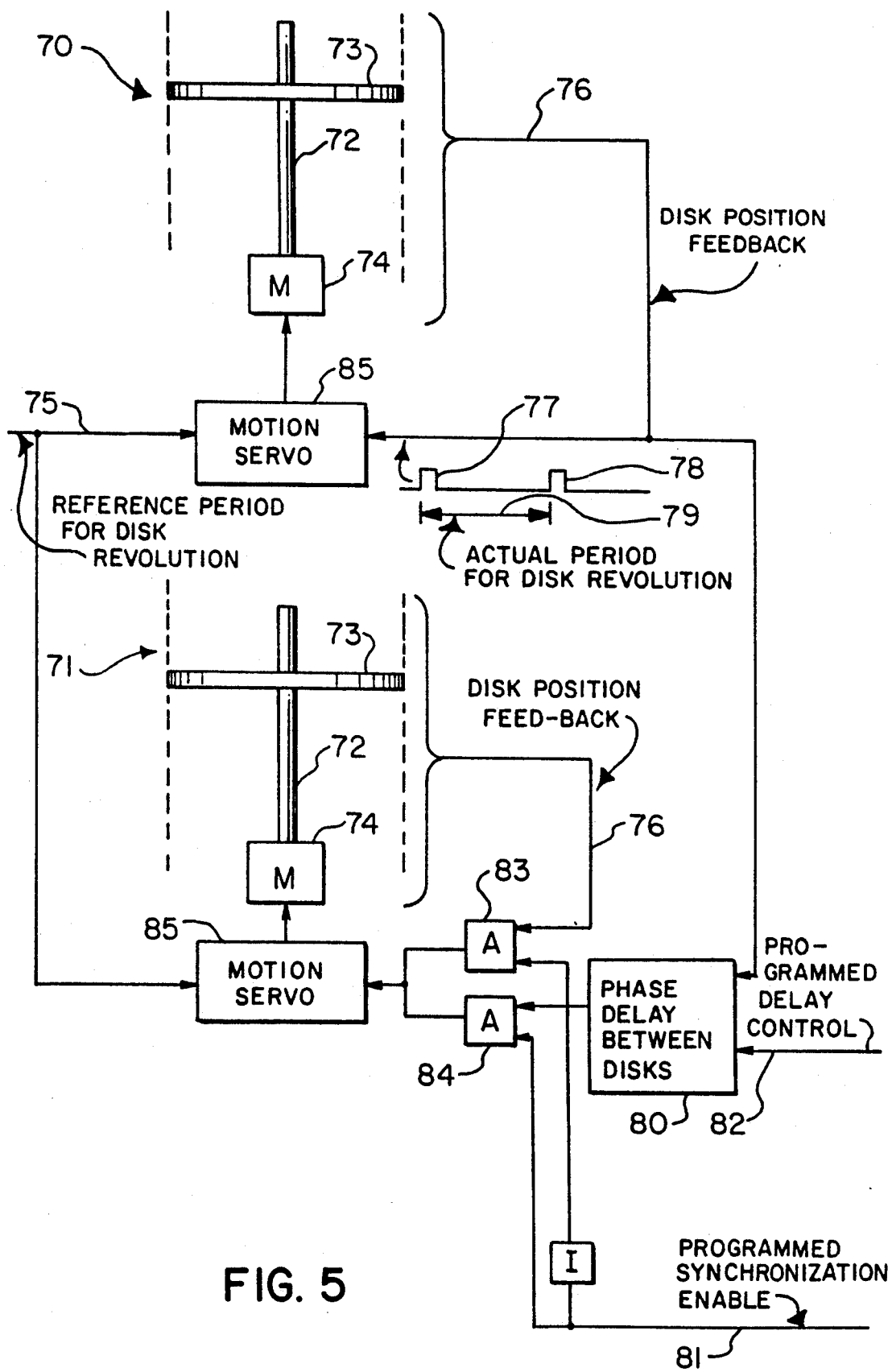
FIG. 5 shows another embodiment of the invention wherein the large data capacity disk file cluster comprises two small data capacity disk drives.

FIG. 5 shows another embodiment of the invention wherein a large data capacity disk file cluster comprises two small data capacity disk drives 70 and 71. Each of the disk drives 70, 71 includes a spindle 72 that supports at least one disk 73. As is indicated by the figure's associated dotted lines, each spindle may support a stack of such disks 73. Each spindle 72 is rotated about its upright axis by means of a motor 74 and a motor servo means 85.

In this embodiment of the invention, but without limitation thereto, the disk drive spindles 72 are driven by a motion servo means 85 to be at the same rotational velocity. This is accomplished a common velocity command signal present on conductor 75. As indicated by the drawing legend, the signal on conductor 75 provides a reference time period in which disks 73 and spindles 72 should experience one revolution.

Each of the disk drives 70,71 provides a velocity/position feedback signal on a conductor 76. As previously described, feedback signal 76 comprises an index signal or pulse, two time adjacent pulses of which are shown at 77 and 78. As indicated by the drawing legend relative disk drive 70, the time interval 79 that expires between pulses 77 and 78 is a measure of the actual time that it took the disk and the spindle of drive 70 to rotate one revolution. While not shown on the drawing, feedback conductor 76 of disk drive 71 provides a feedback signal similar to 77,78, this feedback signal being indicative of that drive's disk/spindle velocity and position.

It should be noted that while signals 75 and 76 are described with reference to one revolution of the disk and of the spindle, within the spirit and scope of the invention, such signals may define either partial or multiple revolutions of the disk and spindle.

In the embodiment of FIG. 5, disk drive 70 is the master disk drive. That is, its feedback signal 76 is connected as an input to a programmable delay network 80 that is associated with drive 71. As previously described, delay network 80 is effective to synchronize the position of the disk of drive 71 to the disk of drive 70, but only when input conductor 81 transmits a high state to AND gate 84.

The programmed synchronization enable signal on conductor 81 operates to enable the programmed position synchronization of the two disk drives 70,71, whereas the amount of position phase shift that will be implemented during such position synchronization, for example 180 degrees, is determined by the programmed delay control signal that is then present on conductor 82.

As before, when synchronization signal 81 is in its low state, AND gate 83 is enabled. Disk drive 71 is now velocity controlled to be of the same velocity as disk drive 70, but no predetermined position relationship will exist between the disk and spindle of these two drives 70,71. However, when synchronization signal 81 is in its high state, AND gate 84 is enabled, and disk drive 71 is not only velocity controlled to be of the same velocity as disk drive 70, but also, a predetermined position relationship will now exist between the disk and spindle of these two drives, the exact phase shift or delay of the spindle of drive 71, relative to the spindle of drive 70, being determined by the programmed delay control signal that is then present on conductor 82.

The present invention is applicable to a great variety of data processing needs. FIG. 6 is a showing of the manner in which the invention, and specifically the FIG. 1 embodiment thereof, can be used to provided (1) mirrored data files that are stored within disk drives A3 and B3, thereby provide for two logical files, (2) interleaved data files that are stored within disk drives C2 and P2, thereby providing for one additional logical file, (3) interleaved data files with parity that are stored within disk drives A4, B4, C4 and P4, thereby providing for one additional logical file, (4) checksummed data files that are stored within disk drives A1, B1, C1 and P1, thereby providing for three additional logical files, and (5) normal data files that are stored within disk drives A2, B2, C3 and P3, thereby providing four additional logical files.

As noted above, in the case of this example, the sixteen actual disk drives are allocated such that eleven addressable logical disk drives are available to the associated data processing system.

While there are numerous potential ways in which the invention can be utilized, the data interleaving scheme of the above example is useful where large data blocks are to be stored and subsequently accessed. Graphics applications are one example. In the present invention the packaged disk drive configuration provides a fast data rate to these large data files by sharing or interleaving the data among a number of individual disk drives.

In the case of mirrored data files, that is where two or more data files having exactly the same data stored in exactly the same logical location (i.e. the same track, sector and head), access time is improved in accordance with the invention by selecting the disk drive whose head is the closest to the data file at the time an access to the data is required by the data processing system. For the example of FIG. 6, the two disk drives A3 and B3 are used to store mirrored data files. In this case, and in accordance with the invention, the positions of these two drives are synchronized such that the index mark provided by the two drives are 180 degrees out of phase. As a result, the latency time of the FIG. 6 disk drive subsystem is reduced by 50% when accessing a mirrored data file, in that the disk drive with the shortest time to the file will the drive that is used to access the data.

The above description of embodiments of the invention describes how the synchronization of velocity and/or rotational position of the various disk drives within a packaged DASD subsystem provides improved performance, as a function of the data storage needs of a particular data processing application, one example of which is shown in FIG. 6. Those skilled in the art will readily visualize yet other embodiments that are within the spirit and scope of the invention. Thus, it is intended that the present invention be limited solely by the following claims.

We claim:

1. A method of providing a disk file memory subsystem for use in a data processing system, comprising
providing a plurality of N individual disk drives, each of said individual disk drives having a spindle upon which a set of disks are mounted, each of said set of disks including at least one disk, providing synchronized positional rotation of the set of disks in said N disk drives, providing mirrored data files on the set of disks within each of said N disk drives, positionally staggering the similar data that is stored in said mirrored data files of each of said N disk drives 360/N degrees of disk rotation, providing an index signal for each revolution of one of the set of disks of one of said N disk drives, and providing said index signal to all other of said N disk drives as a reference position by which said positional staggering may be determined.

2. The method of claim 1 wherein each of said N individual disk drives are provided with a common velocity command signal, thereby causing each set of disks within each of said N individual disk drives to rotate at substantially the same velocity.

3. The method of claim 2 wherein said N individual disk drives are housed in a common housing.

4. A data recording method for writing and then subsequently reading a mirrored data file, comprising the steps of providing a number N of spindle means and at least one recording disk supported for rotation by each of said spindle means, providing an individual motion control means for each of said spindle means, providing N write/read disk transducer means, one for each one of said spindle means, providing phase control means to control said individual motion control means for setting and maintaining a predetermined positional phase relationship of each of said spindle means with respect to each of the other N spindle means, using said N write/read transducer means to write mirror copies of a data file on said recording disk of each of said N spindle means, each of N spindle means supporting at least one disk and at locations that are staggered by 360/N degrees of rotation of said spindle means, and subsequently reading said data file by using an individual write/read transducer means to access the disk of the one spindle means whose momentary rotational position is such that its copy of said data file will be adjacent to the individual write/read transducer means for said one spindle means at the time of a need to read said mirrored data file.

5. The method of claim 4 wherein the step of providing a number N spindle means further comprises the steps of providing spindle means 0, providing spindle means 1, providing spindle means 2,—and, providing spindle means (N−1), and wherein the step of providing phase control means to control individual motion control means for setting and maintaining a predetermined positional phase relationship of each of said spindle means with respect to each of the other N spindle means, further comprises the steps of setting phase relationship of spindle means 0 to all other spindle means as a reference of zero degrees, setting the phase relationship of spindle means 1 in relation to spindle means 0 equal to (1)(360/N) degrees, setting the phase relationship of spindle means 2 in relation to spindle means 0 equal to (2)(360/N) degrees,—and, setting the phase relationship of spindle means (N−1) in relation to spindle means 0 equal to (N−1)(360/N) degrees, to thereby provide stored mirror copies of a data file, said copies being location-staggered on the disks of said spindle means by 360/N degrees, where N is the total number of spindle means.

6. The method of claim 5 wherein said spindle means are controlled to rotate at substantially the same velocity.

7. A programmable large data capacity disk drive subsystem, comprising, a plurality of individually addressable small data disk drives; a master device for said disk drive subsystem selected from one of an oscillator and a master drive which is one of said plurality of drives; and other disk drives not functioning as a master driving which selectively may comprise slave disk drives for said disk drive subsystem, each of said disk drives including a spindle that supports at least one recording disk, motor means for rotating said spindle, and motor servo means for controlling said motor means, a common spindle velocity command signal connected to the motor servo means of each of said disk drives, to thereby cause the spindles of all disk drives to rotate at substantially the same velocity, means providing an individual spindle velocity/position feedback signal for each of said disk drives, each of said individual spindle velocity/position feedback signals defining the rotational velocity and the rotational position of the spindle of each of said disk drives, individual programmable delay means for at least some of said slave drives, each of said individual delay signal means defining an individual position of the spindle of a slave drive, each of said individual delay signal means being responsive and relative to a reference signal of said master device wherein said reference signal is one of an electronically generated signal and a spindle velocity/position feedback signal, and individual program enable means connected to said at least some of said slave drives, each of said individual program enable means having a first state wherein the reference signal from said master device and an individual one of said delay signal means operates to cause one of said at least some of said slave drives to be phase synchronized to the reference signal of said master device, and each of said individual program enable means having a second state wherein the spindle velocity/position feedback signal of said one of said at least some of said slave drives operates to cause said one of said at least some of said slave drives to operate without phase synchronization to the reference signal of said master device.

8. The disk drive subsystem of claim 7 wherein said common spindle velocity command signal provides a reference time period in which the related spindle can experience a predetermined portion of one revolution, and wherein each of said individual spindle velocity/position feedback signals provides a measure of the time period that it took the related spindle to rotate said predetermined portion of one revolution.

9. The disk drive subsystem of claim 8 wherein each of said individual spindle velocity/position feedback signals comprises time separated signal pulses, two time adjacent pulses of which indicate the time period that it took the related spindle to rotate said predetermined portion of one revolution.

10. The disk drive subsystem of claim 9 wherein said predetermined portion of one revolution comprises 360 degrees.

11. The disk drive subsystem of claim 7 wherein said individual program enable means connected to said at least some of said slave drives comprises,
 a plurality of first AND gate means, one for each of said at least some of said slave drives, each of said first AND gate means being enabled by an individual one of said program enable means when is said first state, and each of said first AND gate means receiving a signal as an input an individual one of said individual programmable delay signal means, and the reference signal of said master device, and
 a plurality of second AND gate means, one for each of said at least some of said slave drives, each of said second AND gate means being enabled by an individual one of said program enable means when in said second state, and each of said second AND gate means receiving as an input the spindle velocity/position feedback signal of the related one of said at least some of said slave drives.

12. The disk drive subsystem of claim 11 wherein when said first AND gate means is enabled the spindle of the related one of said at least some of said slave drives is velocity controlled to be of the same velocity as dictated by said master device, and to be in a predetermined position relationship to the spindle of said master drive, said predetermined position being determined by said individual programmable delay signal means, and when said second AND gate means is enabled the spindle of the related one of said at least some of said slave drives is velocity controlled to be of the same velocity as dictated by said master device, without a predetermined relative position relationship between drives.

13. The disk drive subsystem of claim 12 wherein said common spindle velocity command signal provides a reference time period in which the related spindle experiences a predetermined portion of one revolution, and wherein each of said individual spindle velocity/position feedback signals provides a measure of the time period that it took the related spindle to rotate said predetermined portion of one revolution.

14. The disk drive subsystem of claim 13 wherein each of said individual spindle velocity/position feedback signals comprises time separated signal pulses, two time adjacent pulses of which indicate the time period that it took the related spindle to rotate said predetermined portion of one revolution.

15. The disk drive subsystem of claim 14 wherein said predetermined portion of one revolution comprises 360 degrees.

16. A method of providing a disk drive subsystem having a plurality of a number N of individual disk drives, said plurality of individual disk drives comprising a master disk drive of said disk subsystem and other disk drives said other disk drives may be selectively slaved to operate with a predetermined disk position relative to the disk position of said master drive, comprising the steps of,
 providing individually selectable disk position signals for at least some of said slave drives, each of said individual disk position signals defining a position of the disk of the related slave drive relative to the position of the disk of said master drive, and
 providing an individual enabling means for each of said at least some of said slave drives,
 each of said individual enabling means having a first enabling state wherein a disk velocity/position feedback signal from said master drive and an individual one of said disk position signals operates to cause the related one of said slave drives to be position synchronized to the position of the disk of said master drive, and
 each of said individual enabling means having a second disabling state wherein a disk velocity/position feedback signal of the related slave drive operates to cause the related slave drive disk to rotate without a position that is synchronized to the position of the disk of said master drive.
 providing a common disk velocity command signal as a reference time period in which the related disk can experience a predetermined portion of one revolution said predetermined portion of one revolution being comprised of 360 degrees of a disk revolution, and
 providing said individual disk velocity/position feedback signals as a signal that measures the time period that it actually took the related disk to rotate said predetermined portion of one revolution.
 providing mirrored data files within each of said N disk drives, and
 positionally staggering the similar data that is stored in said mirrored data files of each of said N disk drives by 360/N degrees of disk rotation.

17. The method of claim 16 wherein said step of providing an individual velocity/feedback signal for each of said disk drives includes the steps of,
 providing an index position signal during each revolution of a disk of said master drive, and
 providing said index position signal to said slave drives as a reference position by which said positional staggering may be controlled.

18. The method of claim 17 wherein said N disk drives are housed in a common housing.

19. A method of providing a disk file memory subsystem for use in a data processing system, comprising
 providing a plurality of individual disk drives,
 providing synchronized positional rotation of the disks in said disk drives,
 providing mirrored data files on the disks within each of said disk drives, said mirrored data files containing positionally staggered files of similar data,
 providing an index signal for each revolution of the disks of one of said plurality of disk drives, and
 providing said index signal to all other of said plurality of disk drives as a reference position by which said positional staggering may be determined.

20. The method of claim 19 wherein said plurality of disk drives are provided with a common velocity command signal, thereby causing the disks within all of said disk drives to rotate at substantially the same velocity.

21. The method of claim 20 wherein said plurality of disk drives are housed in a common housing.

22. A data recording method for writing and then subsequently reading a mirrored data file, comprising the steps of
 providing a plurality of spindle means and at least one recording disk supported for rotation by each of said spindle means,
 providing an individual motion control means for each of said spindle means,
 providing a plurality of write/read disk transducer means, one for each one of said spindle means, providing control means input to said motion control means for setting the positional phase relationship of each of said plurality of spindle means to a predetermined phase relationship, using said plurality of write/read transducer means to write mirror copies of a data file on the disks supported by said plurality of spindle means, and at locations that are staggered by a given number of degrees of rotation of said spindle means, and subsequently reading said data file by using an individual one of said plurality of write/read transducer means to access the disk of the one spindle means whose momentary rotational position is such that its copy of said data file will be next adjacent to said individual one write/read transducer means for said one spindle means at the time of a need to read said data file.

23. The method of claim 22 wherein said plurality of spindle means are controlled to all rotate at substantially the same velocity.

24. The method of claim 23 wherein said recording disks are magnetic recording disks.

* * * * *